United States Patent [19]

Alphonse et al.

[11] Patent Number: 4,958,355
[45] Date of Patent: Sep. 18, 1990

[54] HIGH PERFORMANCE ANGLED STRIPE SUPERLUMINESCENT DIODE

[75] Inventors: Gerard A. Alphonse, Princeton; Stephen L. Palfrey, Metuchen, both of N.J.

[73] Assignee: RCA Inc., Vaudreuil, Canada

[21] Appl. No.: 330,033

[22] Filed: Mar. 29, 1989

[51] Int. Cl.$^5$ .............................................. H01S 3/19
[52] U.S. Cl. ...................................... 372/45; 372/46; 357/17
[58] Field of Search ...................... 372/45, 46; 357/17

[56] References Cited

U.S. PATENT DOCUMENTS

| | | | |
|---|---|---|---|
| 3,565,702 | 2/1969 | Nelson | 148/172 |
| 3,753,801 | 8/1973 | Lockwood et al. | 148/171 |
| 4,251,780 | 2/1981 | Scifres et al. | 331/94.5 |
| 4,323,856 | 4/1982 | deWaard | 372/46 |
| 4,432,091 | 2/1984 | Kuroda et al. | 372/45 |
| 4,789,881 | 12/1988 | Alphonse | 357/17 |
| 4,793,679 | 12/1988 | Toda et al. | 350/96.15 |
| 4,821,276 | 4/1989 | Alphonse et al. | 372/45 |
| 4,821,277 | 4/1989 | Alphonse et al. | 372/45 |

FOREIGN PATENT DOCUMENTS 59-141282  8/1984  Japan .
2090056  6/1982  United Kingdom .

OTHER PUBLICATIONS

G. A. Alphonse, "Superluminescent Diode Development," May 1986.
N. K. Dutta et al., "Optical Properties of a GaAlAs Superluminescent Diode," *IEEE Journal of Quantum Electronics*, vol. QE-19, No. 4, Apr. 1983, pp. 496-498.
I. P. Kaminow et al., "Measurement of the Modal Reflectivity of an Antireflection Coating on a Superluminescent Diode," *IEEE Journal of Quantum Electronics*, vol. QE-19, No. 4, Apr. 1983, pp. 493-495.
L. N. Kurbatov, "Investigation of Superluminescense Emitted by A. Gallium Arsenide Diode," *Soviet Physics—Semiconductors*, vol. 4, No. 11, May 1971, pp. 1739-1744.
G. A. Alphonse et al., "High-Power Superluminescent Diodes," OSC Conference, Jan. 19-21, 1987.
J. Nieson et al., "High Power 0.83 μm Angle Stripe Superluminescent Diode," Southwest Optics Conference, Feb. 1987.
W. Heitmann, "Reactively Evaporated Films of Scandia and Yttria," *Applied Optics*, vol. 12, No. 2, Feb. 1973, pp. 394-397.
D. R. Kaplan et al., "Exact Calculation of the Reflection Coefficient for Coated Optical Waveguide Devices," *AT&T Bell Laboratories Technical Journal*, vol. 63, No. 6, Jul.-Aug. 1984, pp. 857-877.

(List continued on next page.)

*Primary Examiner*—William L. Sikes
*Assistant Examiner*—Georgia Y. Epps

[57] ABSTRACT

There is provided a super luminescent light emitting device comprising a semiconductor body including a central region and two opposing end regions extending a predetermined distance from the end faces. A gain guiding linear strip of material adjacent to a side of the active region extends between the end faces and is inclined along its longitudinal axis at a predetermined angle relative to a direction normal to at least one of the end faces. An optical beam path of the device has an optical axis of symmetry extending between the end faces parallel to the longitudinal axis of the strip. The beam path has end lateral boundaries at each of the end regions whose lateral carrier and optical confinement is determined by the gain guiding strip to allow light reflected at the end faces to be refracted out of the optical beam path. The device includes index guiding structure extending on opposite sides of the gain guiding strip over the central region of the device parallel to the longitudinal axis of the gain guiding strip. The index guiding structure determines the central lateral boundaries for the optical beam path to provide lateral carrier and optical confinement of the optical beam path at the central region.

14 Claims, 2 Drawing Sheets

OTHER PUBLICATIONS

M. B. Holbrook et al., "External Cavity Operated Angled-Stripe Geometry DH Lasers," *Applied Physics Letter* 36(5), Mar. 1, 1980, pp. 349–350.

I. Ladany et al., "Scandium Oxide Antireflection Coatings for Superluminescent LEDs," *Applied Optics*, vol. 25, No. 4, Feb. 15, 1986, pp. 472–473.

D. R. Scifres et al., "GaAs/GaAlAs Diode Lasers with Angled Pumping Stripes," *IEEE Journal of Quantum Electronics*, vol. QE-14, No. 4, Apr. 1978, pp. 223–227.

Alphonse et al., "High-Power Superluminescent Diodes", IEEE Journal of Quantum Electronics, vol. 24, No. 12, Dec. 1988, pp. 2454 to 2457.

Vassallo, "Polarization-Independent Antireflection Coatings for Semiconductor Optical Amplifiers" Electronics Letters, Jan. 7, 1988, vol. 24, No. 1, pp. 61–64.

Zah et al., "Fabrication and Performance of 1.5 $\mu$m GaInAsP Travelling-Wave Laser Amplifiers with Angled Facets", Electronics Letters, Sep. 10, 1987, vol. 23, No. 19, pp. 990 & 991.

HIGH PERFORMANCE ANGLED STRIPE SUPERLUMINESCENT DIODE

The invention relates to an improved superluminescent diode and in particular, to an angled stripe superluminescent diode having improved lateral confinement.

BACKGROUND OF THE INVENTION

High power radiation emitting devices, such as semiconductor lasers, typically comprise a body of semiconductor material having opposed end faces in which an active layer is positioned between two cladding regions of opposite conductivity. Gain, which is necessary for these high power devices, results from a population inversion which occurs when applied current is increased. The end faces of the body form a resonant cavity such that radiation generated in the active layer is partially reflected back into the semiconductor body by an end face toward the opposing end face. When the current is sufficiently increased above some threshold value the increase in gain causes lasing action to occur. Lasers emit a narrow band of highly coherent radiation having a coherence length of approximately 2 centimeters (cm). Coherent radiation, or radiation having narrow line width, is undesirable in some applications, such as fiber optic gyroscopes, which require high power devices which emit radiation having low coherence. Other devices such as light emitting diodes (LED's) emit a broad band of radiation but operate at low power, insufficient for high power applications.

Superluminescent diodes (SLDs) provide a high power output of broad band low coherent radiation, that being radiation having a coherence length of less than about 200 micrometers ($\mu$m) and typically about 50 $\mu$m. An SLD typically has a structure similar to that of a laser, with lasing being prevented by antireflection coatings formed on the end faces. These coatings must reduce the reflectivity of the end faces to about $10^{-5}$ or less to prevent lasing in a high power SLD and further, this reflectivity must be reduced to about $10^{-6}$ to achieve low spectral modulation. Spectral modulation is the percentage ratio of the difference between the maximum and minimum power output divided by the sum of the maximum and minimum power output and low spectral modulation is 5% or less modulation. Unfortunately, low reflectivity of about $10^{-6}$ at the end faces is difficult to obtain consistently for a given output wavelength and even a slight temperature change which alters the output wavelength will change the reflectivity, thus making the manufacture of low spectral modulation SLDs extremely difficult.

Other SLD structures utilize a stripe interrupt geometry in which a metallized stripe is formed over a portion of an active region. This stripe extends from one end face towards but not up to the opposing end face. The non-metallized region is supposed to be highly absorbing to greatly reduce reflection from the facet near that region. However the high optical field is known to bleach this absorbing region, making it somewhat transparent to the light propagating through it. As a result, facet reflection is not sufficiently eliminated, and the device exhibits high spectral modulation or even becomes a laser at high power.

Due to the aforementioned problems, an SLD has been limited to a maximum output power of about 7 mw continuous wave (cw) and has had high spectral modulation.

In U.S. patent application Ser. No. 040,977 filed Apr. 20, 1987, now U.S. Pat. No. 4,821,277 in the names of Alphonse and Gilbert, there is disclosed an angled stripe SLD where a gain guiding stripe is tilted with respect to the normal to the cleaved facet resulting in low reflectance in the optical beam path. For best results the angle of the tilt with respect to the normal has been less than 5°. The efficiency of this SLD is limited by its lack of lateral confinement at the active region for the optical beam path. While it is known that higher efficiency devices can be obtained by using index-guided structures, this would result in some reflected rays being trapped in the optical beam path. To reduce the trapping of reflected rays the stripe angle would have to be larger than 5°. However, a stripe angle larger than this angle is not practical because the corresponding high refraction angle in air would make fiber coupling to the SLD difficult.

SUMMARY OF THE INVENTION

It is therefore an object of the present invention to provide a super luminescent device having improved lateral confinement of the optical beam path which does not result in an increase of reflection back along the optical beam path.

It is another object of the present invention to provide a super luminescent device having improved lateral confinement of the optical beam path without having to increase the angle of reflection at the end face of the device which would hamper fiber coupling.

In accordance with a broad aspect of the present invention there is provided a super luminescent light emitting device comprising a semiconductor body having spaced first and second opposed end faces with an active region extending therebetween. The body includes a central region and two opposing end regions extending a predetermined distance from the end faces to the central region. The device has gain guiding means comprising a linear strip of material adjacent to a side of the active region extending between the end faces and inclined along its longitudinal axis at a predetermined angle relative to a direction normal to at least one of the end faces. The device includes an optical beam path extending between the end faces in the active region parallel to the longitudinal axis of the gain guiding means. The optical beam path has end lateral boundaries at each of the end regions whose lateral carrier and optical confinement is determined by the gain guiding means to allow light reflected at the end faces to be refracted out of the optical beam path. The device further includes an index guiding means extending over the central region on opposite sides of the gain guiding means parallel to the longitudinal axis of the gain guiding means. The index guiding means determines central lateral boundaries for the optical beam path to provide lateral carrier and optical confinement of the optical beam path in the central region.

The super luminescent device of the present invention allows for improvements in the efficiency in the operation of the super luminescent device because of an improvement in lateral confinement of the optical beam path in the central region. However, the improved lateral confinement does not extend over the end regions of the device which allows for reflected rays to be refracted out of the optical path while not having to increase the angle of the longitudinal axis of the gain guiding means incident to the normal to the end face. An improved operating efficiency is obtained without increases in spectral modulation and increases of refraction angle in air permitting for practical fiber coupling.

In accordance with another aspect of the present invention the lateral step in the index of refraction in the end regions of the optical path is less than the lateral step in the index of refraction in the central region of the optical path.

In accordance with one embodiment of the present invention the index guided means comprises an index guided ridge waveguide. It is envisaged that the index guided ridge may comprise a ridge extending solely along the central region of the body of the device defined by two troughs located on either side of the strip. It is further envisaged that the index ridge waveguide may include two troughs located on either side of the strip where the troughs extend parallel to the longitudinal axis of the strip over the central region and extend laterally outwardly of the strip in the end regions.

In accordance with another embodiment of the present invention the device may comprise a buried heterostructure device with the index guided means comprising a regrown region at the central region that provides a positive index guide over the central region.

BRIEF DESCRIPTION OF THE DRAWINGS

For a better understanding of the nature and objects of the present invention reference may be had by way of example to the accompanying diagrammatic drawings in which.

DETAILED DESCRIPTION OF THE PREFERRED EMBODIMENTS

Figure 1:
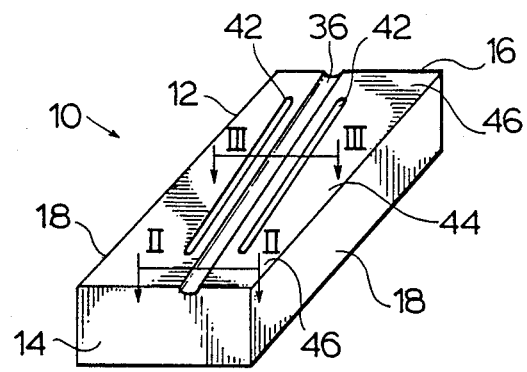
FIG. 1 is a perspective view of a preferred embodiment of a super luminescent device of the present invention.
Figure 2:
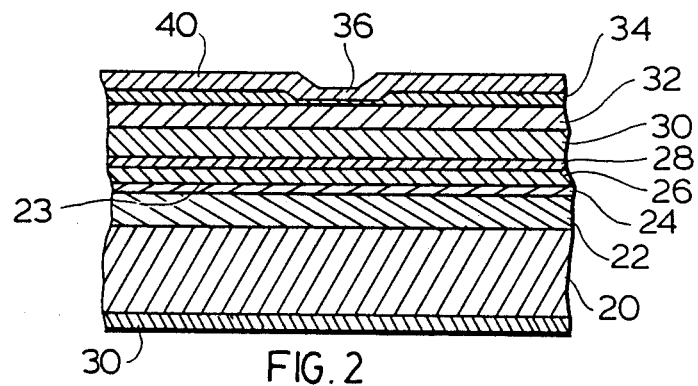
FIG. 2 is a sectional view of the device of FIG. 1 at section lines II—II.

Referring to FIGS. 1 and 2, a super luminescent light-emitting device 10 comprises a body 12 having first and second opposed end faces 14 and 16, respectively, and sidewalls 18 extending therebetween. The body 12 at the end faces 14 and 16 includes a substrate 20 having a first cladding layer 22 thereon, an active layer 24 overlying the first cladding layer 20, a second cladding layer 26 overlying the active layer 24, an etch stop layer 28 overlying the second cladding layer, a third cladding layer 30 overlying the etch stop layer 28, and a capping layer 32 overlying the third cladding layer 30. An electrically insulating layer 34, having an aperture 36 therethrough which extends between the end faces 14 and 16, respectively, and which is nonperpendicular relative to the first and second end faces 14 and 16, respectively, overlies the capping layer 32. A means for electrically contacting the body 12 comprises a first electrical contact 38 which overlies the surface of the substrate 20 opposite the first cladding layer 22 and a second electrical contact 40 which overlies the capping layer 32 in the aperture 36 and insulating layer 34.

The substrate 20 and first cladding layer 22 are of one conductivity type and the second cladding layer 26, etch stop layer 28, third cladding layer 30 and capping layer 32 are of the opposite conductivity type. The refractive index of the active layer 24 should be greater than the refractive index of both the first and second cladding layers 22 and 26, respectively. The body is typically composed of binary group III-V compounds such as GaAs and alloys of such compounds.

The substrate 20 is typically composed of N-type GaAs about 100 micrometers ($\mu$m) thick and has a first major surface parallel to or slightly misoriented from the (100) crystallographic plane. The first cladding layer 22 typically combines the functions of a buffer layer and a cladding layer. The first cladding layer 22 is about 1.5 $\mu$m thick. The second cladding layer 26 is about 0.12 $\mu$m thick. The third cladding layer 30 is about 1.6 $\mu$m thick. The cladding layers 22, 26 and 30 are typically composed of $Al_xGa_{1-x}As$ where x is generally between about 0.4 and 0.5 and typically about 0.45. The active layer 24 is typically about 0.07 $\mu$m thick and is generally composed of $Al_xGa_{1-x}As$ where x is between about 0 and 0.1, depending on the wavelength to be emitted. The etch stop layer 28 is typically about 0.03 $\mu$m thick and is composed of $Al_xGa_{1-x}As$ where x is typically about 0.1. The capping layer 32 is typically about 0.45 $\mu$m thick and is typically composed of P-type GaAs. The insulating layer 34 is typically about 0.15 $\mu$m thick and is preferably composed of silicon oxide deposited by pyrolytic decomposition of a silicon-containing gas, such as silane, in oxygen or water vapor.

Figure 4:
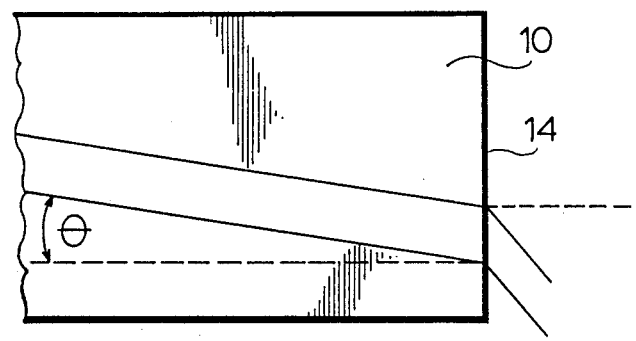
FIG. 4 is a top view of an optical path for the device shown in FIG. 1.

The aperture 36, which is non-perpendicular relative to at least one end face and typically both end faces, provides a means for defining an effective optical beam path by gain guiding within the device. Typically the gain guiding means is a current confining structure, such as the second electrical contact 40 in the aperture 36, which is in the shape of a linear stripe about 5 to 7 $\mu$m wide in the lateral direction, that being the direction perpendicular to the planes of the sidewalls 18. The current confining structure extends between the pair of opposed parallel end faces, 14 and 16 respectively, and has an axis of symmetry which is at an angle $\Theta$ relative to the direction perpendicular to the end faces as shown in FIG. 4. The tangent of the angle $\Theta$ must be greater than or equal to the effective width of the optical beam path in the device divided by the length of the body between the first and second end faces 14 and 16, respectively. This minimizes the Fabry-Perot reflections which occur in a laser cavity due to reflections occurring between the end faces 14 and 16 respectively.

Figure 3:
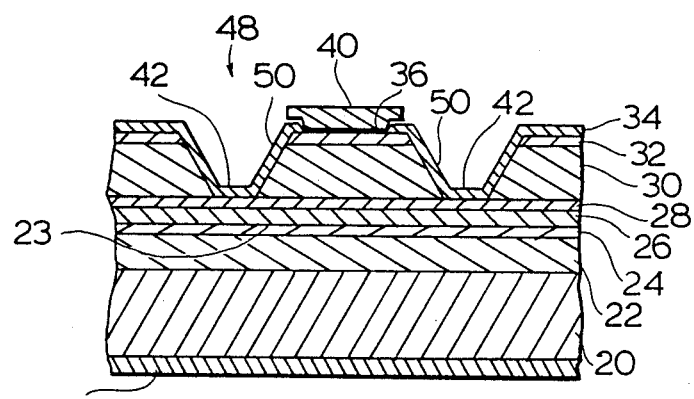
FIG. 3 is a sectional view of the device of FIG. 1 at section lines III—III.

Referring to FIGS. 1 and 3, the super luminescent light emitting devices is illustrated to include two troughs or wells 42. The troughs 42 are formed through standard photolithographic, chemical etching and the depth of the troughs 42 is determined by etch stop layer 28. The troughs 42 provide a ridge over the central region 44 of the device which acts as an index guiding means. The index guiding means for index-guided ridge 48 in this preferred embodiment has edges 50 on opposing sides of the gain guiding strip 36 extending parallel to the longitudinal axis of the gain guiding strip. For strips 36 in the order of 3 $\mu$m to 5 $\mu$m in width the ridge at the central region in the order of 5 to 7 $\mu$m in width, respectively. The index guided ridge determines the central lateral boundaries of the optical beam path providing lateral carrier and optical confinement of the optical beam path in the central region 44.

The index guiding means or ridge 48 has the edges 50 extending in the parallel relation to the strip longitudinal axis to within a predetermined distance from the end faces 14 and 16 of the device 12. Over this predetermined distance, the lateral width of the optical path and optical confinement are determined solely by the gain guiding strip 36. This predetermined distance is referred to as the end regions 46 of device 10. The device 10 has a length of 300 μm with end regions of 25 μm leaving a central region of 250 μm. The width of the wells are in the order of 10 to 12 μm.

Referring to FIG. 3, the angle Θ must have a value such that 2Θ exceeds the critical value for lateral reflection, that being the angle at which there is no refracted ray and thereby total internal reflection exists. For example, the optical beam path has differences in its effective refractive index between that portion of the gain region 23 under the ridge and the remaining laterally adjacent portion of the gain region. These differences in effective refractive index are determined over the central region 44 by the index guiding ridge 48 and over the end regions 46 by the gain guiding strip 36. This difference in index of refraction along the central region 42 of the optical path is greater than the difference of effective index of refraction of the optical beam path over the end regions 44. The difference in effective index of refraction over the central region is about 0.02 and serves to confine radiation within the optical beam path of the device enhancing operating efficiency. The difference of effective index of refraction of the optical path over the end regions is less than 0.005 and permits reflections in the optical beam path at the end faces 14 and 16 to be refracted out of the optical beam path resulting in low spectral modulation. To achieve this in the end region 46, the angle 2Θ must be greater than the critical angle. The critical angle $\Theta_c$ is determined as follows:

$$\Theta_c = \mathrm{Sin}^{-1}[1-(n_2/n_1)^2]^{\frac{1}{2}}$$

where $n_1$ is the effective refractive index of the gain region 23 containing the optical beam and is typically about 3.35 and $n_2$ is the effective refractive index of the laterally adjacent region and is typically about 3.345. Therefore, $\Theta_c$ is typically about 3.13 and the angle Θ must be greater than 1.6 and is chosen to about 5° to account for diffraction spread. The angle Θ may be about equal to the Brewster angle which is equal to the inverse tangent of the refractive index of the medium adjacent the first end face 14, divided by the transverse effective refractive index for light propagating between the end faces. The medium adjacent the first end face 14 is typically air having a refractive index of about 1 and the refractive index of the body 10 is typically 3.35 for GaAs devices. Thus, the Brewster angle is typically about 16.6°. At the Brewster angle the radiation vibrating in the plane of incidence is not reflected, thus resulting in radiation which is predominantly polarized. Further, at this angle the reflected and refracted rays are 90° apart resulting in a non-reflective condition at the emitting end face. This condition allows the elimination of antireflection coatings on the devices' end faces which are typically used to increase output.

The body 10 may be fabricated using liquid-phase epitaxy techniques to deposit the layers. Suitable liquid-phase epitaxy techniques have been disclosed by Nelson in U.S. Pat. No. 3,565,702, issued Feb. 23, 1971 and Lockwood et al in U.S. Pat. No. 3,753,801, issued Aug. 21, 1973. Other epitaxial growth includes vapor phase, organometallic vapor phase, and molecular beam epitaxy. The aperture 36 is formed in the silicon oxide insulating layer 34 by first forming a photoresist layer having an angled stripe aperture therein, over the insulating layer 34 which is then etched by a suitable etchant such as buffered hydrofluoric acid.

The first electrical contact 38 is preferably composed of sequentially deposited germanium, gold, nickel, and gold layers. The second electrical contact 40 is preferably composed of titanium, platinum and gold layers which are sequentially deposited onto a zinc or cadmium diffused surface.

It should be understood that improved current confinement can be obtained by having the capping layer 32 composed of N-type GaAs with zinc diffused therethrough in the region of aperture 36. This will permit for better definition of the lateral boundaries of the optical beam path as defined by the gain guiding means over the end regions 46.

In the operation of the device 10 a bias voltage of the proper polarity is applied to the electrical contacts 38 and 40 respectively, producing light emission in the active region. The aperture 36 provides a means for reducing on-axis reflections of light between the end faces resulting in an emission having low coherence. This device described having index guiding has demonstrated 1% spectral modulation at an output power of 20 mw, cw and a slope efficiency of 0.18 mw/mA.

Figure 5:
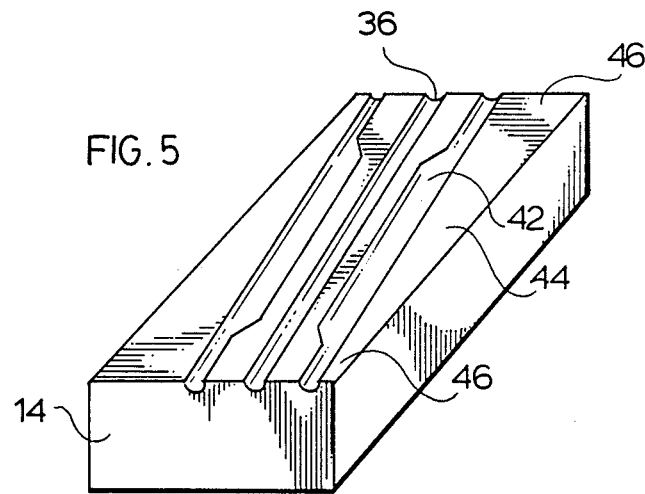
FIG. 5 is a perspective view of another embodiment of a a super luminescent device of the present invention.
Figure 6:
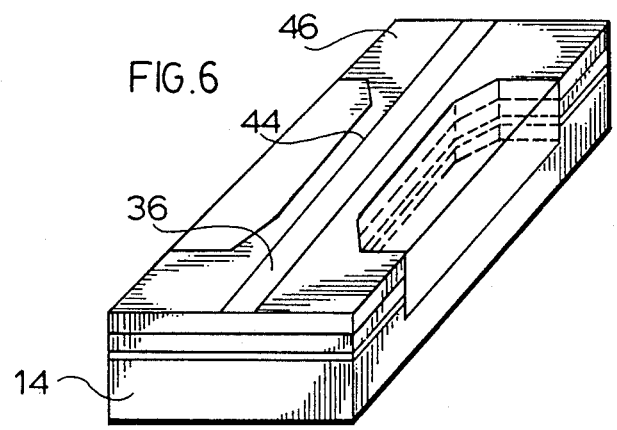
FIG. 6 is a perspective view of a buried heterostructure super luminescent device in accordance with another embodiment of the present invention.

It should be understood that the present invention may be implemented using any suitable index guiding means or structure that effectively controls the current and optical lateral confinement of the optical beam through the central region of the device. This may include other ridge guide structures such as the embodiment shown in FIG. 5, for example. In this embodiment, the width of the ridges is different at the end regions 46 than over the central region 44. Index guiding may be implemented by buried heterostructure devices such as shown in FIG. 6, for example, or buried ridge devices.

What we claim as new and desire to secure by Letters Patent of the United States of America is:

1. A super luminescent light emitting device comprising:
    a semiconductor body having spaced first and second opposed end faces with an active region extending therebetween, the body including a central region and two opposing end regions extending a predetermined distance from the end faces to the central region;
    gain guiding means comprising a linear strip of material adjacent to a side of the active region extending between the end faces and inclined along its longitudinal axis at a predetermined angle relative to a direction normal to at least one of the end faces;
    an optical beam path extending between the end faces at the active region parallel to the longitudinal axis of the gain guiding means, the optical beam path having end lateral boundaries at each of the end regions whose lateral carrier and optical confinement is determined by the gain guiding means to allow light reflected at the end faces to be refracted out of the optical beam path; and,
    index guiding means extending over the central region on opposite sides of the gain guiding means parallel to the longitudinal axis of the gain guiding means, the index guiding means determining central lateral boundaries for the optical beam path to provide lateral carrier and optical confinement for the optical beam path in the central region.

2. The device of claim 1 wherein the index guided means comprises an index guided ridge waveguide.

3. The device of claim 2 wherein the index guided ridge comprises a ridge extending solely along the central region of the body of the device defined by two troughs located on either side of the strip.

4. The device of claim 2 wherein the index guided ridge comprises a ridge that extends between the end faces, the ridge being defined by two troughs located on either side of the strip where the troughs extend parallel to the longitudinal axis of the strip over the central region and extend laterally outwardly of the strip at the end regions.

5. The device of claim 1 wherein the device is a buried heterostructure device with the index guided means comprises a regrown region at the central region that provides a positive index guide over the central region.

6. The device of claim 2 wherein the ridge waveguide is between 5 and 7 $\mu$m wide and the gain guiding strip is respectively between 3 and 5 $\mu$m wide.

7. The device of claim 1 wherein the gain guiding means comprises a blocking layer having a current blocking portion and a current passing portion forming an effective current passing opening therein.

8. The device of claim 1 wherein the linear strip of material comprises a metallized layer which contacts the body through an aperture in an insulating layer on the body.

9. The device of claim 1 wherein the optical beam path has a given distance between the end faces and is oriented so that the optical axis intersects the end faces, where the tangent of the angle is greater than or equal to the width of the effective optical beam path divided by the given distance, the values of the tangent and angle being such that together the values tend to minimize the spectral modulation within the path.

10. The device of claim 9 wherein the angle is about equal to the Brewster angle.

11. The device of claim 9 wherein the angle is greater than about 3.13 degrees.

12. The device of claim 1 wherein the angle is about 5 degrees.

13. The device of claim 1 wherein the end regions have a lateral step in the index of refraction of the optical path which is less than a lateral step in the index of refraction of the optical path in the central region.

14. The device of claim 13 wherein the end region lateral step in the index of refraction is less than 0.005 and the central region lateral step in index of refraction is about 0.02.

* * * * *